(12) United States Patent
Wilson

(10) Patent No.: US 10,401,443 B1
(45) Date of Patent: Sep. 3, 2019

(54) SURFACE MAPPING OF INDUCTIVE PHYSICAL PROFILE OF WIRELESS POWER PRODUCTS

(71) Applicant: Integrated Device Technology, Inc., San Jose, CA (US)

(72) Inventor: David Wilson, Soquel, CA (US)

(73) Assignee: Integrated Device Technology, Inc., San Jose, CA (US)

(*) Notice: Subject to any disclaimer, the term of this patent is extended or adjusted under 35 U.S.C. 154(b) by 1 day.

(21) Appl. No.: 15/903,832

(22) Filed: Feb. 23, 2018

(51) Int. Cl.
*G01R 33/10* (2006.01)
*H02J 50/10* (2016.01)
*G01R 33/24* (2006.01)

(52) U.S. Cl.
CPC ............. *G01R 33/10* (2013.01); *G01R 33/24* (2013.01); *H02J 50/10* (2016.02)

(58) Field of Classification Search
CPC ....... B60L 3/0069; B60L 3/12; G01R 31/025; G01R 27/025; G01R 31/007
USPC .......................................... 324/500, 509, 512
See application file for complete search history.

(56) References Cited

U.S. PATENT DOCUMENTS

| | | | |
|---|---|---|---|
| 2017/0060150 A1* | 3/2017 | Stefanski | G05D 23/27 |
| 2018/0036740 A1* | 2/2018 | Nelson | B02C 19/18 |
| 2018/0059176 A1* | 3/2018 | Ding | G01R 1/0433 |

* cited by examiner

Primary Examiner — Giovanni Astacio-Oquendo
(74) Attorney, Agent, or Firm — Haynes and Boone, LLP

(57) ABSTRACT

A system for mapping magnetic fields around a transmission coil is presented. The method includes selecting a selected induction loop from an array of selectable induction loops arranged adjacent the transmission coil, detecting current from the selected induction loop, the current being generated by a magnetic field from a transmission coil, to obtain measured values; and comparing measured values with expected values.

15 Claims, 4 Drawing Sheets

SURFACE MAPPING OF INDUCTIVE PHYSICAL PROFILE OF WIRELESS POWER PRODUCTS

TECHNICAL FIELD

Embodiments of the present invention are related to wireless power systems and, specifically, to mapping the inductive profile of wireless power products.

DISCUSSION OF RELATED ART

Mobile devices, for example smart phones and tablets, are increasingly using wireless power charging systems. Typically, a wireless power charging system includes a transmitter coil that is driven to produce a time-varying magnetic field and a receiver coil that is positioned relative to the transmitter coil to receive the power transmitted in the time-varying magnetic field. It can be difficult, with low cost and high precision, to determine whether an unexpected inductively interactive material is on or near the transmitter surfaces.

Therefore, there is a need to develop technology that allows for mapping the inductive profile around wireless transmission components.

SUMMARY

In accordance with aspects of certain embodiments, a wireless transmitter is presented for mapping an inductive profile. A wireless transmitter according to some embodiments includes an array of selectable induction loops positioned to map a magnetic field produced by a transmit coil of the wireless transmitter; a selection circuit coupled to select induction loops from the array of selectable induction loops; a detection circuit coupled to detect current in the elected induction loop from the selection circuit; and a processing circuit coupled to the array of selectable induction loops, the processing circuit executing instructions to select the selected induction loop from the array of selectable induction loops and provide signals to the selection circuit, receive data related to a magnetic field produced by an activated transmitter coil from the selected induction loop through the detection circuit, and compare expected values of the data with measured values of the data.

A method of mapping magnetic fields around a transmission coil according to some embodiments includes selecting a selected induction loop from an array of selectable induction loops, detecting current from the selected induction loop, the current being generated by a magnetic field from a transmission coil, to obtain measured values; and comparing measured values with expected values.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
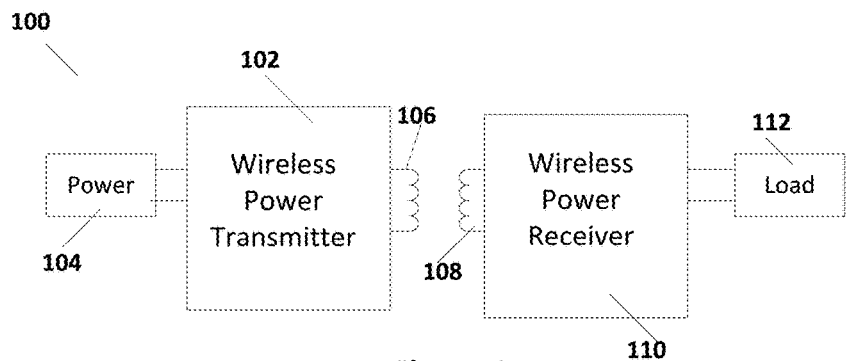
FIG. 1 illustrates a wireless power transmission system.

FIG. 1 illustrates a system 100 for wireless transfer of power. As illustrated in FIG. 1, a wireless power transmitter 102 drives a coil 106 to produce a magnetic field. A power supply 104 provides power to wireless power transmitter 102. Power supply 104 can be, for example, a battery based supply or may be powered by alternating current for example 120V at 60 Hz. Wireless power transmitter 102 drives coil 106 at, typically, a range of frequencies, usually according to one of the wireless power standards. Embodiments of the present invention may be used with any of the wireless power standards, or with any wireless power transmission system.

There are multiple standards for wireless transmission of power, including the Alliance for Wireless Power (A4WP) standard and the Wireless Power Consortium standard, the Qi Standard. Under the A4WP standard, for example, up to 50 watts of power can be inductively transmitted to multiple charging devices in the vicinity of coil 106 at a power transmission frequency of around 6.78 MHz. Under the Wireless Power Consortium, the Qi specification, a resonant inductive coupling system is utilized to charge a single device at the resonance frequency of the device. In the Qi standard, coil 108 is placed in close proximity with coil 106 while in the A4WP standard, coil 108 is placed near coil 106 along with other coils that belong to other charging devices. FIG. 1 depicts a generalized wireless power system 100 that operates under any of these standards.

As is further illustrated in FIG. 1, the magnetic field produced by coil 106 induces a current in coil 108, which results in power being received in a receiver 110. Receiver 110 receives the power from coil 108 and provides power to a load 112, which may be a battery charger and/or other components of a mobile device. Receiver 110 typically includes rectification to convert the received AC power to DC power for load 112.

Figure 2:
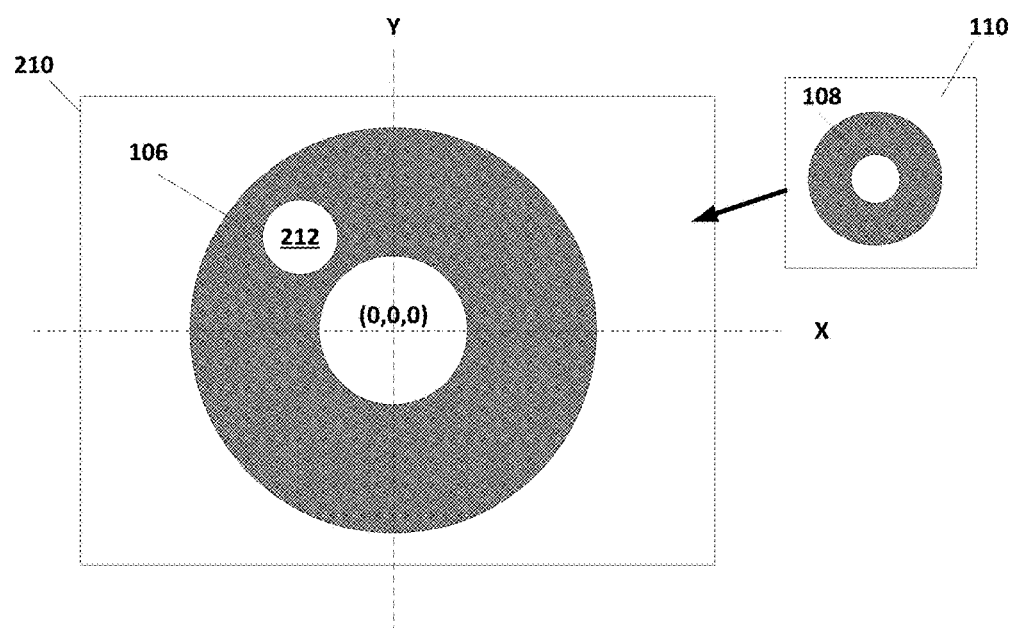
FIG. 2 illustrates a receiver of a wireless power transmission system positioning against a wireless power transmitter.

FIG. 2 illustrates an example of a power receiver 110 being positioned relative to a pad 210 that includes transmitter coil 106. FIG. 2 also illustrates an X-Y-Z orthogonal coordinate system, where the X and Y axis are shown and the Z axis is out of the figure orthogonal to both the X and Y axis. As shown in FIG. 2, the coordinates (0,0,0)—X=0, Y=0, Z=0—corresponds to the center of transmission coil 106. The position of device 110 can be described in this coordinate system as $(x_d, y_d, z_d)$.

In some cases, there may also be foreign objects 212 in the vicinity of pad 210. Objects 212 can interfere with the efficient transfer of wireless power and may also cause safety hazards by heating effects due to absorbing the power being transferred by coil 106. However, it is often difficult at a low cost and/or high precision for a wireless power transmitter to determine whether unexpected inductively interactive materials such as foreign objects 212 are on or near the transmitter surface. Furthermore, per-unit calibration is often done in a factory environment or not be done at all, which in turn greatly limits the ability of a transmitter to self-calibrate or self-determine presence of likely foreign inductively interactive materials such as object 212. The main confounding factors are normal component variations and manufacturing variations in producing pad 210 and coil 106 which in total can combine into very substantial uncertainties, especially where low cost components and/or manufacturing techniques are used in production.

According to some embodiments of the present invention, an array of selectable induction loops are positioned to map a magnetic field produced by a transmission coil. In some embodiments, the array of selectable induction coils can be an array of wires positioned to cover an area over the transmission coil. A selected induction loop can be formed by selecting a pair of vertical wires and a pair of horizontal wires, which forms the selected induction loop in their intersection. In some embodiments, the transmitter may be formed by an array of transmitter coils. In that case, the array of selectable induction loops includes the non-transmitting coils. In either case, measured values related to the magnetic field can be detected at the location of the selected induction coil. Such measured values can be compared with expected values for that particular induction loop in the array of selectable induction loops. The comparison can, for example, be a ratiometric comparison. A map of the comparison values can be used to determine the presence of foreign objects in the area of the transmitter coil.

Figure 3A:
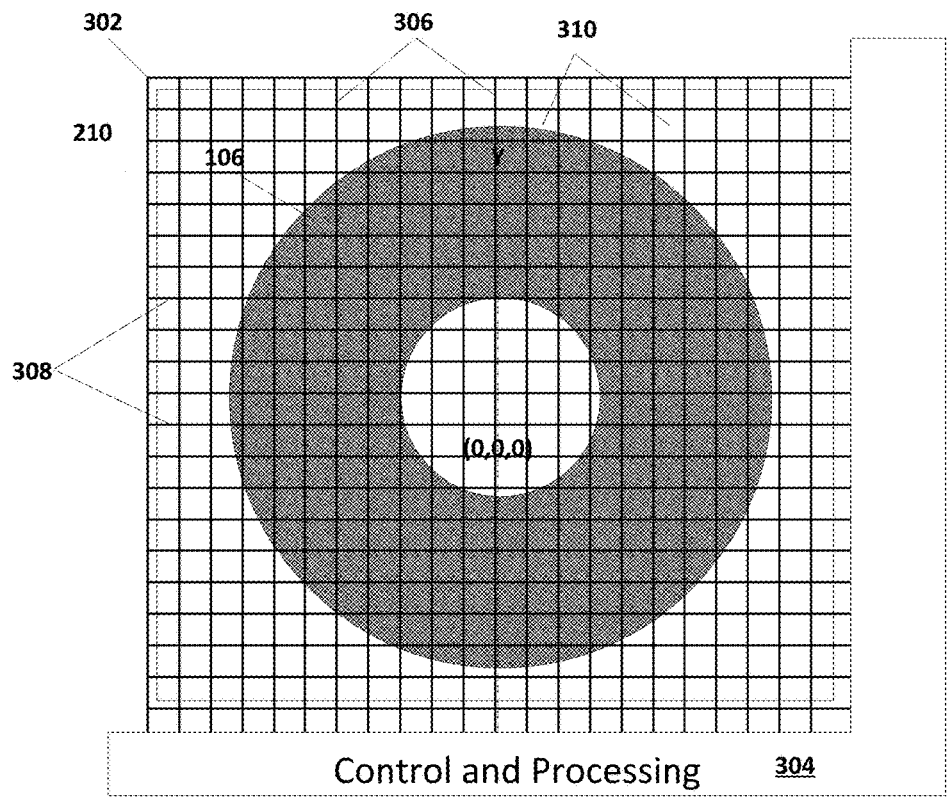
FIGS. 3A and 3B illustrate a mapping grid according to some embodiments.

FIG. 3A illustrates an example embodiment of the present invention. As shown in FIG. 3A, an array of wires 302 is placed across the surface of the transmitter pad 210 such that it covers at least a portion of transmitter coil 106 and pad 210. Although the array of wires 302 may not completely cover the entirety of pad 210, in some embodiments, the array of wires 302 can be positioned centrically with transmitter coil 106 so that the magnetic field produced by transmitter coil 106 can be measured symmetrically.

Although any grid spacing can be used, in some embodiments the grid spacing can be on the order of 1 cm (e.g. 0.25 cm-3 cm). The grid spacing can control the spatial resolution at which the magnetic field transmitted by transmitter coil 106 can be measured and may be subject to cost and efficiency optimization. Array of wires 302 can include horizontal wires 308 and vertical wires 306 that form the grid pattern. In some embodiments, wires can be configured to form patterns other than grids. Horizontal wires 308 and vertical wires 306 do not make physical contact and therefore are lightly coupled capacitively to each other where they cross. Light capacitive coupling can avoid losses to the AC magnetic power delivery field generated by transmission coil 106. The light capacitive coupling is sufficient to create a measurement loop. As is further illustrated in FIG. 3A, array of wires 302 is coupled to control and processing circuit 304. Control and processing circuit 304 determines a signal related to the magnetic field at each induction loop 310, which is formed as an inductive loop by the intersection of horizontal wires 308 and vertical wires 306. As discussed above, the array of selected induction loops are determined by intersecting pairs of horizontal wires 308 and vertical wires 306.

Induction loop 310 illustrated in FIG. 3A illustrates an inductive measurement loop formed by a pair of horizontal wires 308 and a pair of vertical wires 306. The center of each induction loop 310 can be identified by its X-Y coordinates in the coordinate system illustrated in FIG. 2. In some embodiments, induction loop 310 is formed by the intersection of adjacent horizontal wires 308 and adjacent vertical wires 306, however, larger induction loops 310 can be formed by using non-adjacent pairs of horizontal wires 308 and vertical wires 306, at the cost of reduced spatial resolution. The magnetic field from transmission coil 106 can be mapped by scanning through a series of induction loops 310. In some embodiments, a two-dimensional scan can be performed while in other embodiments one-dimensional scans can be provided.

Figure 3B:
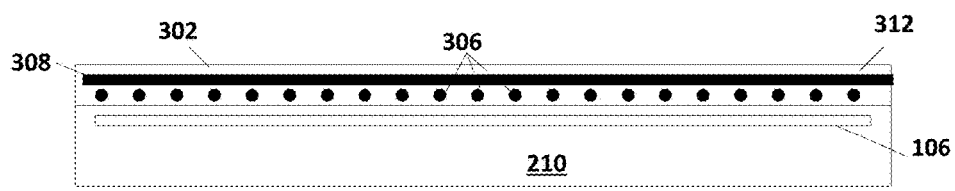

FIG. 3B illustrates a cross section of the embodiment illustrated in FIG. 3A. As illustrated in FIG. 3B, transmitter coil 106 can be embedded in pad 210. In some embodiments, transmitter coil 106 can be mounted on the surface of pad 210. Array of wires 302, having horizontal wires 308 and vertical wires 306, are arranged over pad 306. In some cases, horizontal wires 308 and vertical wires 306 can be embedded in an insulator 312. Additionally, as can be seen in FIG. 3B, vertical wires 306 and horizontal wires 308 are not in physical contact and therefore are capacitively coupled to one another through part of insulator 312.

Figure 4:
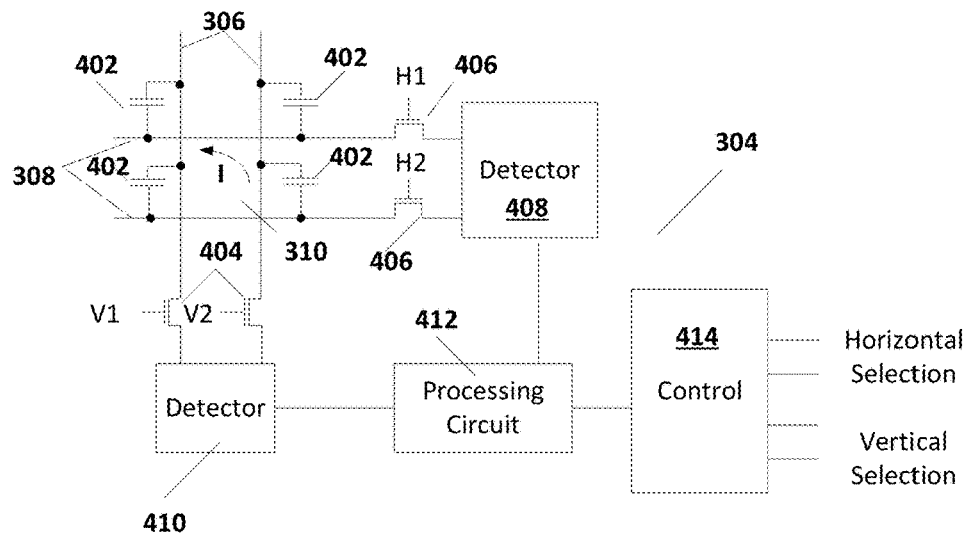
FIG. 4 illustrates components of an example inductance mapping system according to some embodiments.

FIG. 4 illustrates an example of control and processing circuit 304. As illustrated in FIG. 4, each of horizontal wires 308 are coupled to detector 408 through transistors 406 while each of vertical wires 306 are coupled to detector 410 through transistors 404. For clarity, only two of horizontal wires 308 and two of vertical wires 306 are illustrated in FIG. 4. Transistors 406 and transistors 404 receive control signals to their gates from control block 414. Pairs of horizontal wires 308 are selected by turning on the transistors 404 associated with that selected pair. Similarly, pairs of vertical wires 306 are selected by turning on the transistors 406 associated with that selected pair. When transistors 406 and transistors 404 receive control signals to turn on, then the selected pair of horizontal wires are coupled to detector 408 and the selected pair of vertical wires are coupled to detector 410. The selected pair of horizontal wires 308 and the selected pair of vertical wires 306 form an induction loop, the selected induction loop 310, at their intersection around which a current I is induced by the presence of the magnetic field generated by transmission coil 106.

Detector 410 is coupled to the selected pair of vertical wires 306 through turned-on transistors 404. Detector 408 is coupled to the selected pair of horizontal wires 308 through turned-on transistors 406. Transistors 404 and transistors 406 have gates coupled to a control circuit 414, which turns on the selected pair of horizontal wires 308 and vertical wires 306 according to signal from a processing circuit 412. Detectors 410 and 408 can detect the current I in selected induction loop 310 and provides signals in response to the current I to processing circuit 412. The current I can be measured in any number of ways, including utilizing shunt resistances.

Processing circuit 412 can include any processor, microprocessor, or other circuitry capable of processing digital data. Processing circuit 412 may further include volatile and non-volatile memory to store data and programming instructions. Processing circuit 412 may further include analog-to-digital converters that can receive and digitize analog signals, for example signals from detectors 408 and 410. Processing circuit 412 may further include a user interface that allows a user to input instructions and receive data from processing circuit 412. Other components that are typical with processor circuits may also be included.

Processor circuit 412 can select an inductive loop 310 by choosing a pair of horizontal wires 308 and a pair of vertical wires 306 to couple to detectors 410 and 408, respectively, to form a selected induction loop 310. Control 414 receives the selection signals from processor 412 and generates horizontal signals (H1 and H2) for the gates of transistors 406 and vertical signals (V1 and V2) for the gates of transistors 404. The selected horizontal lines 308 and the selected vertical lines 306 can be adjacent to one another or may be separated by any number of other lines. Detectors 410 and 408 detect the current in the resulting induction loop 310 determined by the pair of selected horizontal wires 308 and the pair of selected vertical lines 306 and provides signals to processor 412 indicative of that current I. As such, processor circuit 412 can direct a scan through a series of inductive loops 310 to survey the magnetic field in the area over transmitter coil 106.

In particular, the scan determined by processing circuit 412 can be any serial survey of induction loops 310, each measurement block being defined by the pair of selected horizontal wires 308 and pair of selected vertical wires 306. Each such defined induction loop 310 is located at a X-Y location over transmitter coil 106. Scans can be 2-D scans of an area over transmitter coil 106, may be a linear scan on a line over transmitter coil 106, or can be some other pattern of induction loops 310.

Figure 5:
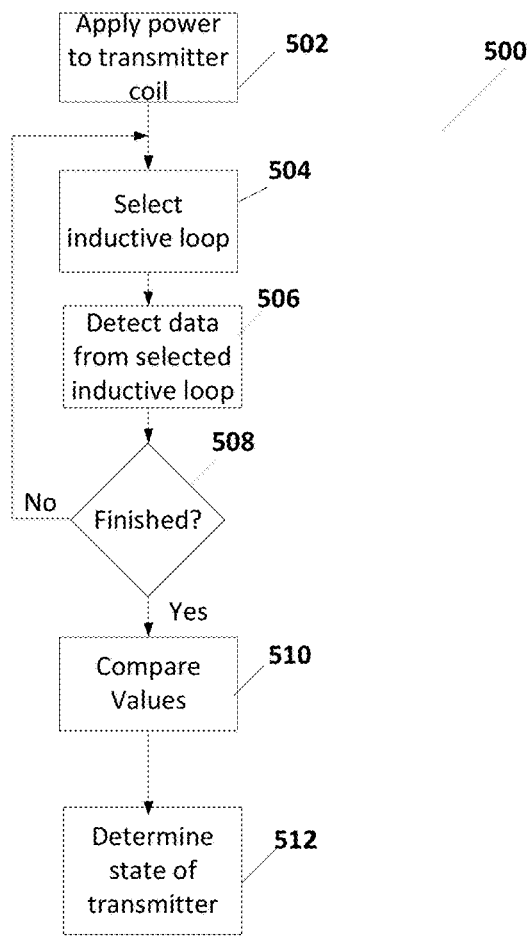
FIG. 5 illustrates a process that can be executed in the inductance mapping system as illustrated in FIG. 4.

FIG. 5 illustrates a process 500 that can be executed by processor circuit 412. Instructions for executing process 500 can be stored in a memory of processing circuit 412. As illustrated by process 500, to determine the surface condition of transmitter 102, an AC field is applied to transmitter coil 106 in step 502. In step 504, an inductive loop 310 is selected. In step 506, current I is measured in the selected inductive loop 310. In step 508, it is determined whether all of the inductive loops in a scan have been measured. Steps 504, 506, and 508 are repeated until current measurements are obtained from each inductive loop 310 in a scan of the surface over transmitter coil 106.

In step 510, the measured values from each of the inductive loops 310 can be compared to a stored "expected result" for each of the inductive loops 310. The expected results can be those that are common to all transmitters of the same construction, or may be those measured under controlled conditions in a separate calibration step. In some embodiments, the measured response is compared to the expected result ratiometrically. By comparing the measurements ratiometrically rather than absolutely, all variances from component tolerance and most variance from manufacturing tolerance can be eliminated from the calculation.

The result of the comparison in step 510 can be used as a high precision determination as to whether or not there is any distortion of the applied magnetic field as compared with the expected result. This in turns enables processing circuit 412, which is a part of transmitter 102, to know and calibrate its surface condition, with the simplest implementation being to wait to do the calibration until the surface is measured to be clear of any unexpected inductively interactive materials.

As discussed above, this surface mapping scan can be one or two dimensional, and with arbitrarily higher resolution determined by the number of sensing wires used in the scan. The end result is a highly accurate ability to detect foreign objects that is achieved with low cost, low tolerance materials and manufacturing methods.

This method can also be used with a receiver device 110 present to map both the position of various "friendly metals" as well as identify the position of the power receiving coil 108 on the receiver 110. This information could, for example, be used to choose the optimum power delivery method where multiple coils are included in transmitter 102 and/or receiver 110 design. It could also be used for foreign object detection prior to and/or during power delivery.

Figure 6:
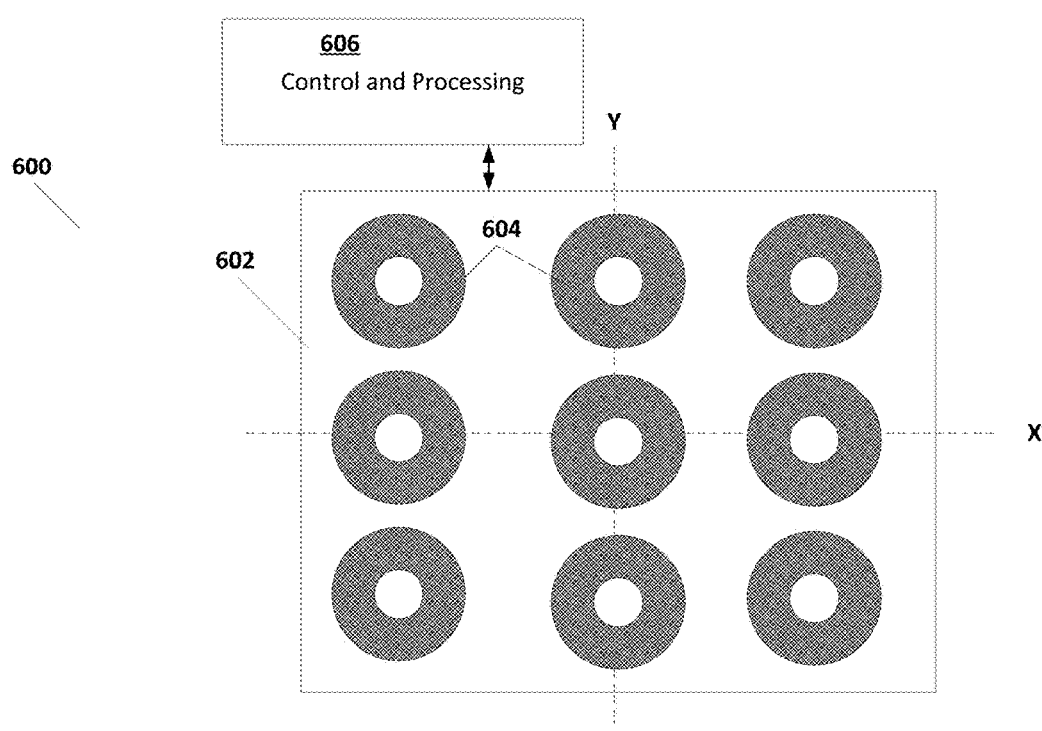
FIG. 6 illustrates an embodiment with an array of transmit coils.

FIG. 6 illustrates another embodiment of the present invention. As illustrated in FIG. 6, an array of transmit coils 604 can be used in transmitter 102 in place of transmitter coil 106. Transmitter coils 604 can be formed on a pad 602. The array of transmit coils 604 can also be used as a grid array such as grid array 302. Grid array 302 can then be formed by the array of transmit coils 604 themselves. By stimulating each transmit coil 604 in the array of transmit coils and measuring the output current from the other transmit coils 604 in the arrangement, some determination (at lower resolution than with a larger number of sensing wires) can be made of the surface conditions of transmitter 102 over antenna array 600. As discussed above with the example illustrated in FIG. 3A having horizontal wires 308 and vertical wires 306, this is a ratiometric determination which could include cross comparisons among the various transmit coils 106 as well as comparisons with a stored table of expected measurements for each of the transmit coils when one of the transmit coils 106 is activated.

Consequently, control and processing 606 can operate similarly to that illustrated in FIG. 4 and FIG. 5, with crossed wires being replaced with coils 604. In particular, detectors 408 and 410 are coupled to a selected one of transmitter coils 604 by control 414 and the data is provided to processing circuit 412 when another of transmitter coils 604 is activated.

The above detailed description is provided to illustrate specific embodiments of the present invention and is not intended to be limiting. Numerous variations and modifications within the scope of the present invention are possible. The present invention is set forth in the following claims.

What is claimed is:

1. A wireless transmitter, comprising:
    an array of selectable induction loops positioned to map a magnetic field produced by a transmit coil of the wireless transmitter;
    a selection circuit coupled to select induction loops from the array of selectable induction loops;
    a detection circuit coupled to detect current in the elected induction loop from the selection circuit; and
    a processing circuit coupled to the array of selectable induction loops, the processing circuit executing instructions to
        select the selected induction loop from the array of selectable induction loops and provide signals to the selection circuit,
        receive data related to a magnetic field produced by an activated transmitter coil from the selected induction loop through the detection circuit, and compare expected values of the data with measured values of the data.

2. The wireless transmitter of claim 1, wherein the instructions further include instructions to activate the transmitter coil to produce the magnetic field.

3. The wireless transmitter of claim 1, wherein the processing circuit scans through the array of selectable induction loops.

4. The wireless transmitter of claim 3, wherein a map of comparisons between expected values and measured values is provided.

5. The wireless transmitter of claim 4, further including determining presence of a foreign object from the map.

6. The wireless transmitter of claim 1, wherein the expected values are obtained from a controlled calibration process.

7. The wireless transmitter of claim 1, wherein the expected values are preset.

8. The wireless transmitter of claim 1, wherein the array of selectable inductor loops is formed by a grid array of wires, the grid array of wires including a plurality of vertical wires and a plurality of horizontal wires.

9. The wireless transmitter of claim 8, wherein the instructions to select an induction loop includes selecting a pair of vertical wires from the grid array of wires and selecting a pair of horizontal wires from the pair of horizontal wires.

10. The wireless transmitter of claim 1, wherein the array of selectable inductor loops is formed by an array of transmit coils.

11. A method of mapping magnetic fields, comprising:
selecting a selected induction loop from an array of selectable induction loops arranged adjacent a transmission coil,
detecting current from the selected induction loop, the current being generated by a magnetic field from the transmission coil, to obtain measured values; and
comparing measured values with expected values.

12. The method of claim 11, further including creating a map of comparison values.

13. The method of claim 12, further including determining presence of foreign objects from the map.

14. The method of claim 11, wherein selecting a selected induction loop includes selecting a pair of horizontal wires and a pair of vertical wires wherein the induction loop is formed by an intersection of the pair of horizontal wires and the pair of vertical wires.

15. The method of claim 11, wherein selecting a selected induction loop includes selecting a coil from an array of transmission coils.

* * * * *